(12) United States Patent
Fukunaga et al.

(10) Patent No.: US 7,586,528 B2
(45) Date of Patent: Sep. 8, 2009

(54) COLOR SENSOR AND COLOR IMAGE PICKUP METHOD

(75) Inventors: Toshiaki Fukunaga, Kanagawa (JP); Daisuke Yokoyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 747 days.

(21) Appl. No.: 11/076,911

(22) Filed: Mar. 11, 2005

(65) Prior Publication Data
US 2005/0206759 A1    Sep. 22, 2005

(30) Foreign Application Priority Data
Mar. 22, 2004    (JP) .................... P. 2004-082698

(51) Int. Cl.
  H04N 3/14    (2006.01)
  H04N 5/335    (2006.01)
  H04N 9/04    (2006.01)
(52) U.S. Cl. .................. 348/274; 348/272; 348/273; 348/275; 348/277; 348/279; 348/294; 257/440; 257/461
(58) Field of Classification Search .............. 348/223.1, 348/266–283, 294, 222.1; 257/440, 461
See application file for complete search history.

(56) References Cited

U.S. PATENT DOCUMENTS 3,717,724 A * 2/1973 Montgomery, III ......... 348/272
5,063,439 A * 11/1991 Tabei ......................... 348/272
5,518,934 A * 5/1996 Forrest et al. ................. 438/73
5,965,875 A * 10/1999 Merrill ....................... 250/226
6,632,701 B2   10/2003 Merrill
6,864,557 B2 * 3/2005 Turner et al. ................ 257/440
6,911,712 B2 * 6/2005 Dosluoglu et al. .......... 257/440
6,956,273 B2 * 10/2005 Koizumi ..................... 257/440
6,998,660 B2 * 2/2006 Lyon et al. .................. 257/294
7,166,880 B2 * 1/2007 Merrill et al. ............... 257/294
7,218,347 B2 * 5/2007 Shinohara ................... 348/272
2003/0209651 A1   11/2003 Iwasaki

FOREIGN PATENT DOCUMENTS

| JP | 58-103164 A | 6/1983 |
| JP | 7-38165 A | 2/1995 |
| JP | 2872759 B2 | 1/1999 |
| JP | 3315213 B2 | 6/2002 |

* cited by examiner

*Primary Examiner*—David L Ometz
*Assistant Examiner*—Richard M Bemben
(74) *Attorney, Agent, or Firm*—Sughrue Mion, PLLC

(57) ABSTRACT

A color sensor comprises: light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R); and a first portion that adds a signal corresponding to the stimulus value of blue (B) as a positive sensitivity component to one of: the first light reception element; and a red (R) color signal generated by the first light reception element.

16 Claims, 7 Drawing Sheets

COLOR SENSOR AND COLOR IMAGE PICKUP METHOD

BACKGROUND OF THE INVENTION

1. Field of the Invention

This invention relates to a solid state image pickup device with deposited photoelectric conversion layers, which will be hereinafter also called color sensor, and in particular to an image pickup device close to the spectral sensitivity of human eyes and moreover with no pseudocolor.

2. Description of the Related Art

A solid state image pickup device in a related art has a structure wherein a photoelectric conversion layer is provided on almost the same plane as a charge transfer passage. However, this structure has disadvantages in that if the pixel size approaches the same degree as the light wavelength with an increase in the number of pixels, it becomes hard to guide light to the photoelectric conversion layer and that degradation of light use efficiency caused by the light loss in a color filter cannot be avoided. Further, since R color light, G color light, and B color light are detected at different positions, color separation may occur, causing pseudocolor to occur. Thus, to avoid this, a low-pass filter is required and thus light loss is also caused by the filter. If emerald color is added to a color filter to provide four colors, the problem of pseudocolor is not solved.

As a solution to such a weak point of the solid state image pickup device of the photoelectric conversion layer of planar placement type in the related art, a solid state image pickup device with a light reception section as a deposition structure was already proposed in JP-A-58-103165 in 1983. Color sensors each wherein as specific deposition means, a deposited light reception section is formed using the wavelength dependency of the absorption coefficient of an Si semiconductor and color separation is performed in the depth direction are reported in JP-A-7-38165, U.S. Pat. No. 5,965,875 and U.S. Pat. No. 6,632,701. However, the disclosed arts involve problems of broad wavelength dependency of the spectral sensitivity in the deposited light reception section and insufficient color separation. Particularly, color separation of blue and green is insufficient.

To solve the problems, US2003/0209651A1 proposes a method of providing a sensor unit for accepting green light on the top of a light reception element of an Si semiconductor and receiving blue color light and red color light at the light reception element of an Si semiconductor. However, the method also has the disadvantage in that the difference from the spectral sensitivity of the visual sense of a human being is large.

In Japanese Patent No. 2872759, an attempt is made to take in light in the intermediate range of blue light and green light in a single-plate system and a multiplate system and is added to computation processing of received light image information, thereby providing image information matched with the spectral sensitivity of the visual sense of a human being. However, correction of the spectral sensitivity is also insufficient in the single-plate system and the multiplate system. Further, Japanese Patent No. 3315213 reports a deposition sensor wherein the charge move speed of an organic semiconductor is adjusted and the electric signal of an image is made finer, but the spectral sensitivity close to the sensibility of a human being cannot yet be realized.

As described above, if the image pickup part of the color sensor is put into multiple layers to improve the sensitivity, pseudocolor, etc., the color reproducibility of a played-back (reproduced) image becomes insufficient because of the alienation from the spectral luminous efficacy, and means for satisfying both the sensitivity and the color quality cannot yet be provided.

SUMMARY OF THE INVENTION

It is therefore an object of the invention to provide a color sensor capable of reproducing a pseudocolor-free image at high sensitivity and moreover faithful to the visual sense of a human being.

The inventor can accomplish the object of the invention by providing the following color sensor and color image pickup methods as a result of diligently making a search for a method of compensating for the difference between the spectral sensitivity of a color sensor and the spectral distribution of the visual sense of human eyes and matching or making approximate image information caught by the color sensor with or to image information obtained by the visual sense from both sides of designing light reception elements and operation processing of information caught by the light reception elements.

That is, the invention is as follows:

(1) A color sensor comprising: light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R); and a first portion that adds a signal corresponding to the stimulus value of blue (B) as a positive sensitivity component to one of: the first light reception element; and a red (R) color signal generated by the first light reception element.

(2) The color sensor described above in (1) wherein the light reception elements further comprises: a second light reception element that generates a green (G) color signal corresponding to the stimulus values of green (G); and a third light reception element that generates a blue (B) color signal corresponding to the stimulus values of blue (B), and wherein the first light reception element comprises a first photoelectric conversion film having a maximum value of main light absorption of 580 to 650 nm, the second light reception element comprises a second photoelectric conversion film having a maximum value of main light absorption of 530 to 560 nm, and the third light reception element comprises a third photoelectric conversion film having a maximum value of main light absorption of 400 to 460 nm.

(3) The color sensor described above in (1) further comprising: a fourth light reception element having spectral sensitivity to a spectral area (BG) of intermediate color of blue (B) and green (G) in the RGB color system; and a second portion that performs subtraction processing of a signal generated in the fourth light reception element from the red (R) color signal at a ratio based on a preset factor, so as to form a new red color signal (R').

(4) The color sensor described above in (3) wherein the light reception elements comprises: a first light reception element that generates the red (R) color signal corresponding to the stimulus values of red (R); a second light reception element that generates the green (G) color signal corresponding to the stimulus values of green (G); and a third light reception element that generates the blue (B) color signal corresponding to the stimulus values of blue (B), and wherein the first light reception element comprises a first photoelectric conversion film having a maximum value of main light absorption of 580 to 650 nm, the second light reception element comprises a second photoelectric conversion film having a maximum value of main light absorption of 530 to 560 nm, the third light reception element comprises a third photoelectric conversion film having a maximum value of main light absorption of 400 to 460 nm, and the fourth light reception element comprises a fourth photoelectric conversion film having a maximum value of main light absorption of 480 to 530 nm.

(5) The color sensor described above in any of (1) to (4), wherein the light reception elements comprises a first light reception element that generates the red (R) color signal corresponding to the stimulus values of red (R), and wherein the first light reception element comprises a substance having a maximum value of main light absorption in 400 to 460 nm.

(6) The color sensor described above in any of (1) to (5) wherein the light reception elements are configured to form deposition films comprising an organic semiconductor on an Si substrate.

(7) The color sensor described above in any of (1) to (6) wherein the first light reception element is provided as a top layer of the light reception elements, the top layer being adjacent to a light reception face of the color sensor, and wherein the first light reception element comprises a first material having red sensitivity and a second material having blue sensitivity, the second material serving as the first portion.

(8) The color sensor described above in (7) wherein the second material is organic coloring matter.

(9) The color sensor described above in (7) wherein the second material is semiconductor ultrafine particles.

(10) A color image pickup method comprising: picking up an image with the light reception elements of a color sensor as described above in (1); and performing operation processing of adding a signal corresponding to the stimulus value of blue (B) as a positive sensitivity component to a red (R) color signal generated by the first light reception element, so as to perform color reproduction.

(11) The color image pickup method described above in (10) further comprising: performing subtraction processing of a signal generated in an element for receiving green (G) from the red (R) color signal at a ratio based on a preset factor, so as to form a new red color signal (R'); and applying the new red color signal (R') as the red color signal in color mixing processing, so as to perform the color reproduction.

(12) A color image pickup method comprising: picking up an image with the light reception elements of a color sensor described above in (3); performing operation processing of adding a signal corresponding to the stimulus value of blue (B) as a positive sensitivity component to a red (R) color signal generated by the first light reception element; performing subtraction processing of a signal generated in the fourth light reception element from the red (R) color signal at a ratio based on a preset factor, so as to form a new red color signal (R'); and applying the new color red (R') color signal as a red color signal in color mixing processing, so as to perform color reproduction.

(13) The color image pickup method described above in any of (10) to (12) further comprising: performing subtraction processing of a signal generated in an element for receiving green (G) from the blue (B) color signal at a ratio based on a preset factor, so as to form a new blue color signal (B'); and applying the new blue color signal (B') as a blue color signal in color mixing processing, to perform color reproduction.

(14) The color image pickup method described above in any of (10) to (13) further comprising: performing subtraction processing of a signal generated in an element for receiving blue (B) from the green (G) color signal at a ratio based on a preset factor, so as to form a new green color signal (G'); and applying the new green color signal (G') as a green color signal in color mixing processing, so as to perform color reproduction.

(15) A color image pickup method comprising: picking up an image with the light reception elements of a color sensor described above in (7); performing subtraction processing of a signal generated in an element for receiving green (G) from the red (R) color signal at a ratio based on a preset factor, so as to form a new red color signal (R'); and applying the new red color signal (R') as a red color signal in color mixing processing, so as to perform color reproduction.

(16) A color image pickup method comprising picking up an image with the light reception elements of a color sensor as described in (7); performing subtraction processing of a signal generated in the fourth light reception element from the red (R) color signal at a ratio based on a preset factor, to form a new red color signal (R') and applying the new red (R') color signal as a red color signal in color mixing processing, so as to perform color reproduction.

(17) The color image pickup method described above in (15) or (16), further comprising: performing subtraction processing of a signal generated in an element for receiving green (G) from the blue (B) color signal at a ratio based on a preset factor, so as to form a new blue color signal (B'); and applying the new blue color signal (B') as a blue color signal in color mixing processing, to perform color reproduction.

(18) The color image pickup method described above in any of (15) to (17), further comprising: performing subtraction processing of a signal generated in an element for receiving blue (B) from the green (G) color signal at a ratio based on a preset factor, so as to form a new green color signal (G'); and applying the new green color signal (G') as a green color signal in color mixing processing, so as to perform color reproduction.

The color sensor of the invention is characterized by the fact that in addition to adopting the deposition structure as the configuration of the sensor, (1) the means for adding a signal generated in the element for receiving blue (B) light as a positive sensitivity component to the light reception element for generating a red (R) color signal in the color sensor is provided considering that positive simulation for blue is contained in the spectral area of a stimulation signal sensed as red by the visual sense of a human being, whereby an almost ideal color signal is formed.

In addition to (1) wherein blue light coloring matter is mixed in the photosensitive layer (molecular film) for red light, preferably (2) the fourth light reception element having spectral sensitivity to the spectral area (BG) of intermediate color of blue (B) and green (G) is provided and the color sensor of the invention further has the means for performing subtraction processing of a signal generated in the fourth light reception element from the red (R) color signal at a ratio based on a preset factor, thereby forming a new red (R') color signal, whereby a red color signal still closer to the ideal can be formed.

Further, operation processing of subordinate negative spectral stimulation outside the main spectral areas contained by blue and green color stimulation signals that the RGB color system has is performed for revealing the spectral stimulation, whereby the color reproducibility can be still more improved.

That is, in the invention, the blue photosensitive component is added to the red photosensitive light reception element, preferably the fourth light reception element for compensating for negative sensitivity of red stimulation in the blue green light area is provided, and operation processing of adding negative spectral stimulation in the RGB color system to the colors generated by the red, blue, and green light reception elements is performed, whereby the image picked up by the color sensor is made approximate to the spectral composition of the RGB color system also referred to as color matching functions of the ideal spectral characteristic corresponding to the visual sense, and the color reproducibility of the produced image is improved.

Accordingly, color reproducibility close to high sensitivity, high resolution, and spectral luminous efficacy can be provided and the object of the invention can be satisfied.

The read and transfer circuit for detecting and transferring the color light signal generated by each light reception element is formed on the Si substrate, whereby an image electric signal can be used as with a usual read circuit of a color image signal.

DETAILED DESCRIPTION OF THE INVENTION

As a light reception element of a color sensor of a deposition structure of the invention, any can be used if it is a photosensitive and photoelectric conversion system capable of sensing any of red color light, green color light, or blue color light, executing photoelectric conversion of the light, and generating the corresponding color signal. Preferred photosensitive and photoelectric conversion systems are an organic thin film system, an organic and inorganic hybrid system, and an inorganic particle and thin film system. The light reception element of the preferred photosensitive and photoelectric conversion system among them is a light reception element made of the organic thin film system and is a system having an organic coloring matter layer (molecular film) of photosensitivity and photoelectric conversion property among the organic thin film systems.

Therefore, in the description of the color sensor of the deposition structure of the invention that follows, a color sensor having an organic thin film system, particularly an organic coloring matter layer (molecular film) as a photosensitive layer is taken as an example, but the invention is not limited to it.

To begin with, the basic principle of the color sensor of the deposition structure of the invention will be discussed.

The color sensor of the invention is a deposition color sensor having a matrix of unit pixels each including a deposition film having a deposition structure of a photosensitive layer (molecular film) and a donor-property layer (molecular film) (or an acceptor-property layer (molecular film)) and means for detecting a charge move based on a transition of a carrier optically excited with a photosensitive molecule in the photosensitive layer (molecular film) between the photosensitive layer (molecular film) and the donor-property layer (molecular film) (or the acceptor-property layer (molecular film)), and converting into an electric signal. The configuration of the color sensor will be discussed with the accompanying drawings.

Figure 1:
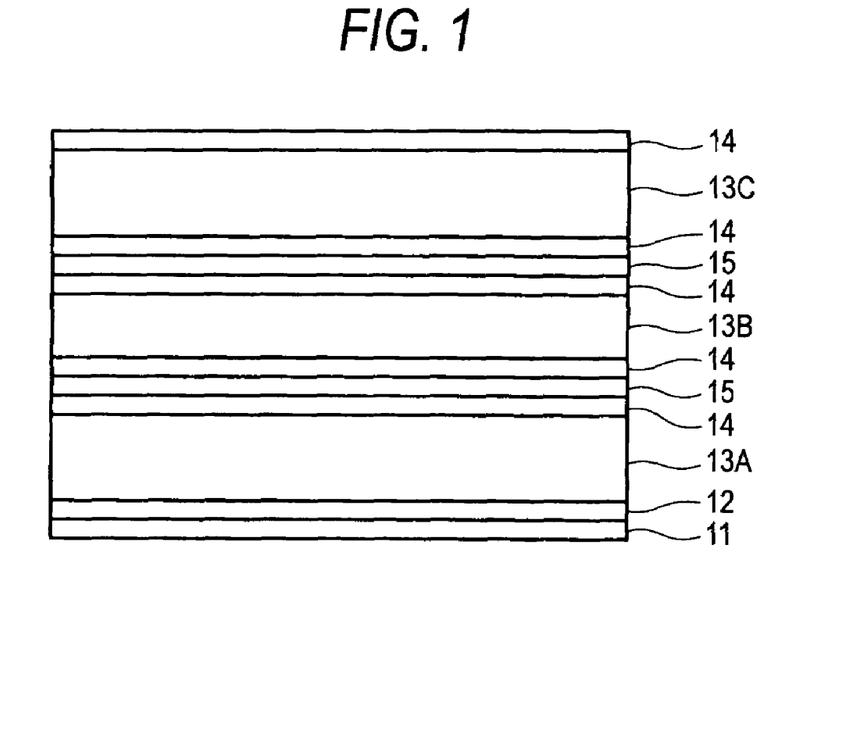
FIG. 1 is a fragmentary sectional view to show an example of a color sensor of the invention.

FIG. 1 is a fragmentary sectional view to show an example of the color sensor of the invention. The color sensor of the invention is prepared by forming an electrode 12, a photoelectric conversion film 13A (containing an acceptor-property layer (molecular film) and a photosensitive layer (molecular film)), a transparent electrode 14, an insulating film 15, a transparent electrode 14, a photoelectric conversion film 13B, a transparent electrode 14, an insulating film 15, a transparent electrode 14, a photoelectric conversion film 13C, and a transparent electrode 14 on a substrate 11, for example. Each photoelectric conversion film has sensitivity in its photosensitive area and forms a light reception element for generating a color signal of A, B, etc., upon reception of light.

Figure 2:
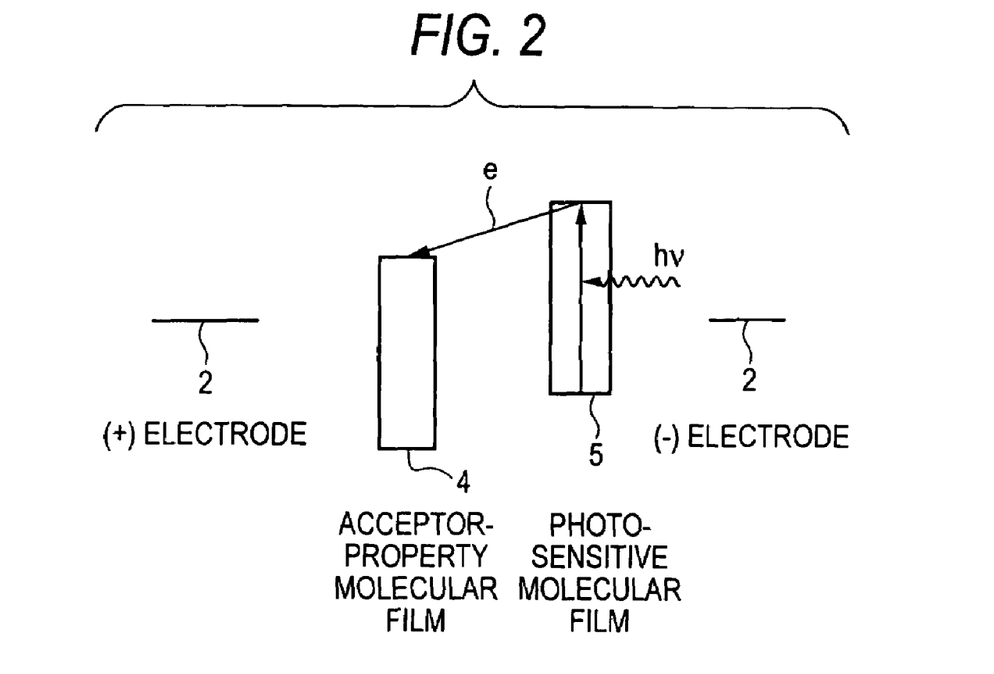
FIG. 2 is a conceptual drawing of light quantum reception, electron excitation, and electron move steps of a light reception element of the color sensor of the invention.

FIG. 2 is a conceptual drawing of light quantum reception, electron excitation, and electron move steps to describe the operation principle of the light reception element of the color sensor of the invention. The operation principle of the light reception element of the color sensor having the light reception element of the configuration of a photoelectric conversion film containing a photosensitive layer (molecular film) and an acceptor-property layer (molecular film) will be discussed with FIG. 2 (FIG. 1 shows three light reception elements of the photoelectric conversion films 13A, 13B, and 13C, one of which will be discussed with reference to FIG. 2). If the light reception element of the color sensor has a photosensitive layer (molecular film) 5 and an acceptor-property layer (molecular film) 4, when light is applied to the photosensitive layer (molecular film) 5 in the pixel as indicated at the energy level in FIG. 2, a photosensitive molecule is optically excited and an electron-hole pair (carrier pair) can be produced in the photosensitive layer (molecular film) 5. At this time, the excited electron makes a transition to the acceptor-property layer (molecular film) 4. Consequently, a current based on charge separation can be observed in an external circuit (not shown) connected to an electrode.

If the light reception element of the color sensor has a photosensitive layer (molecular film) and a donor-property layer (molecular film), as light is applied to a photosensitive molecule in the pixel, a hole makes a transition to a donor-property molecule and consequently, a current based on charge separation can be observed in an external circuit (not shown) connected to an electrode.

The photosensitive layer (molecular film) usually has a plurality of layers deposited and the photosensitive layers have different photosensitive areas each for sensing color light of a different spectral composition and giving an excited electron to the layer (molecular film) or accepting an excited hole. Therefore, three deposition units (light reception elements) each having a photosensitive layer (molecular film), an acceptor-property layer (molecular film), and an insulating film different in the photosensitive area accept red light, green light, and blue light of three primary colors.

Next, the principle of matching or making approximate the spectral composition of a color image recorded by the color sensor as the target of the invention with or to the spectral distribution of the spectral luminous efficacy of a human being will be discussed.

Figure 3:
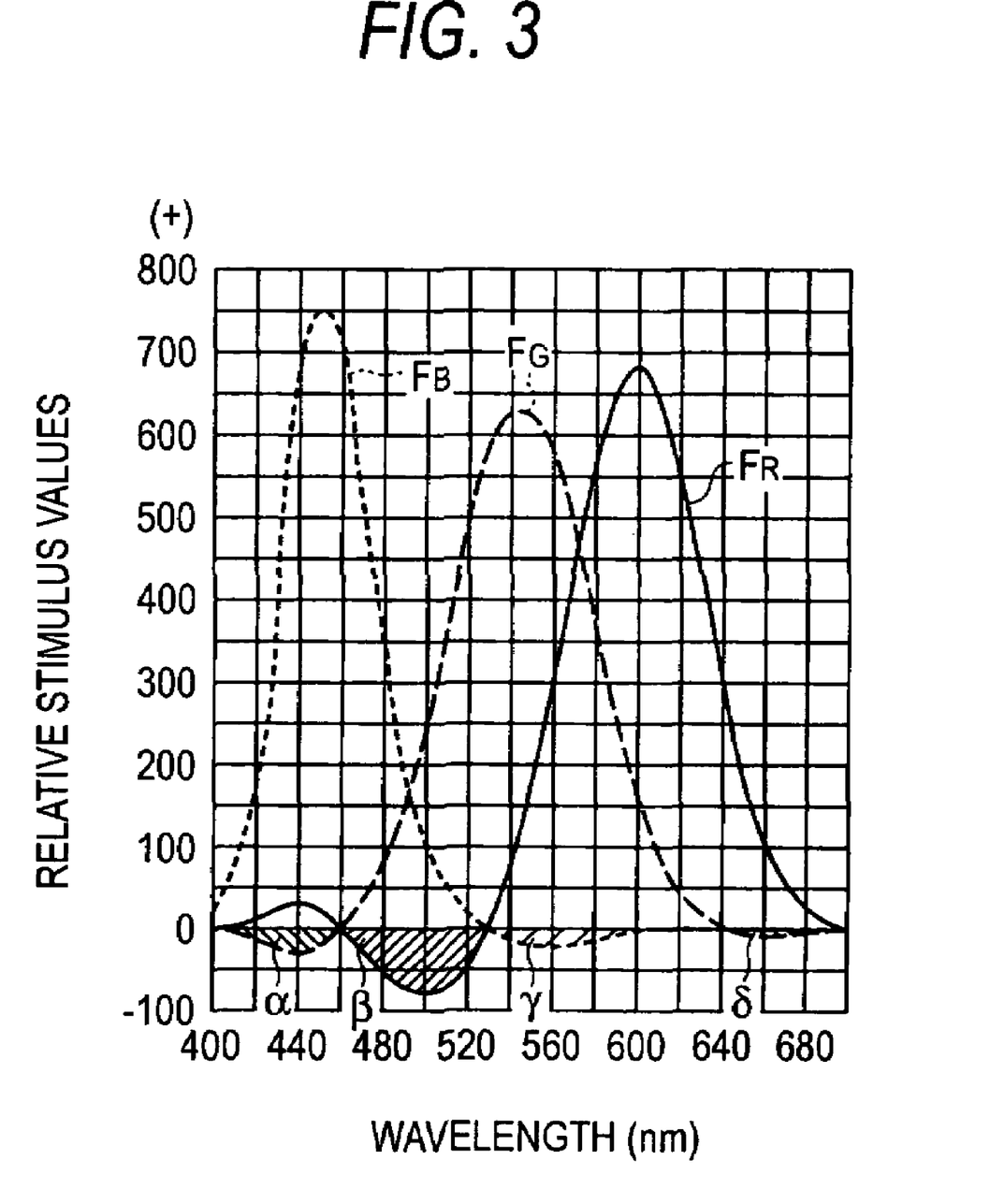
FIG. 3 shows the color matching functions of CIE1931 RGB color system.

FIG. 3 is a drawing to show the color matching functions of CIE1931 RGB color system and therefore the spectral composition of the stimulus values of light of three primary colors corresponding to the average visual sense of human beings, the ideal spectral composition of reproduced colors at which the inventions aims. In the ideal spectral luminous efficacy distribution of human eyes, a subordinate positive sensitivity component of red stimulation exists in the wave range of about 400 nm to 460 nm, red negative sensitivity exists in the wave range of about 460 nm to 530 nm (portion of β), green negative sensitivity exists in the wave ranges of about 400 nm to 460 nm and 640 nm to 680 nm (portions of α and δ), and blue negative sensitivity exists in the wave range of about 530 nm to 620 nm (portion of γ).

Figure 4:
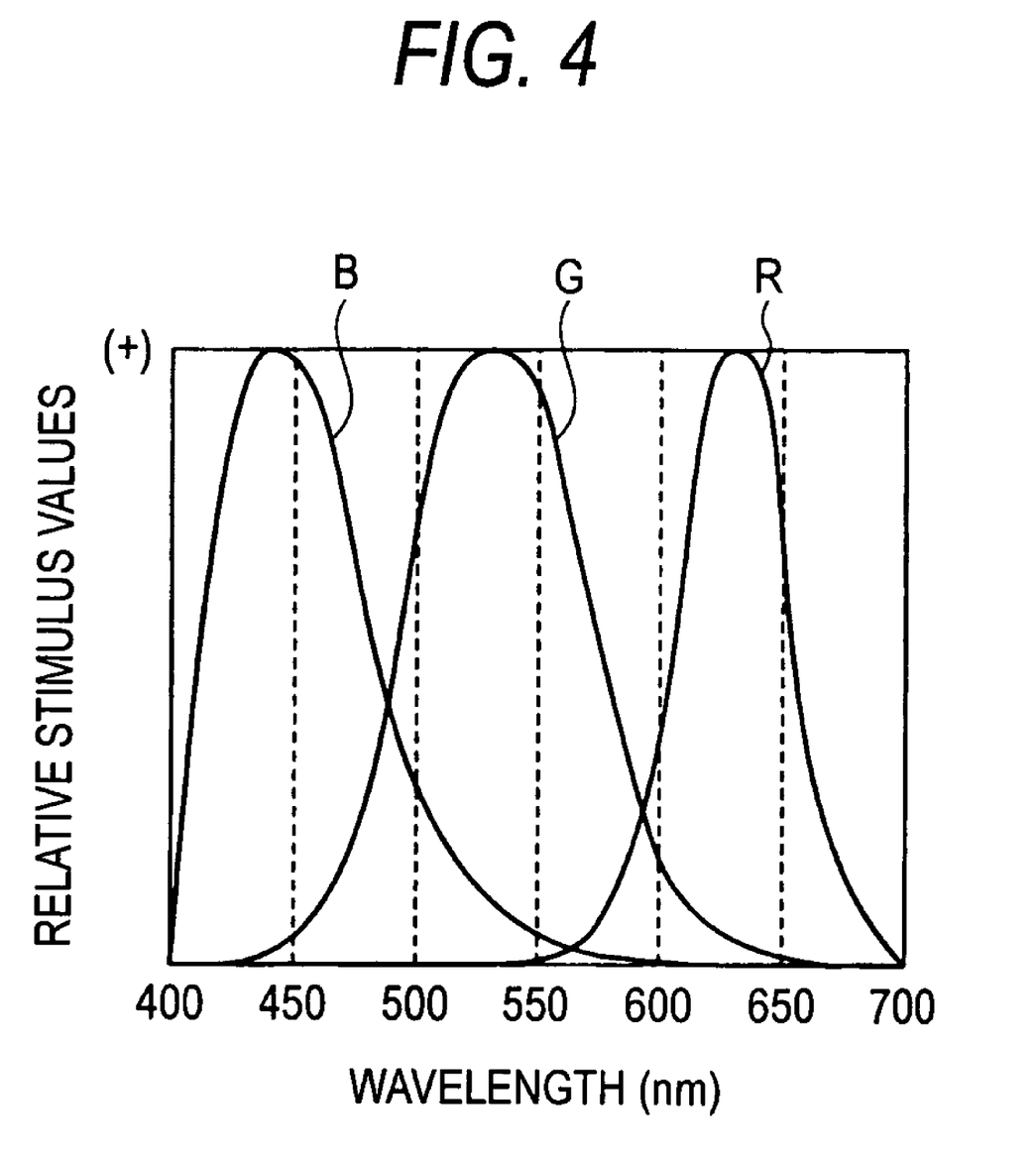
FIG. 4 shows typical spectral sensitivity distributions of red, blue, and green light reception elements.

On the other hand, FIG. 4 shows typical spectral sensitivity distributions of red, blue, and green light reception elements usually used. It can be said that the difference between FIGS. 3 and 4 is the difference between the color accepted physicochemically by the color sensor and the color accepted sensually by the visual sense of a human being.

The red, blue, and green light reception elements usually used with the color sensor receive each the photosensitive wavelength light of the photosensitive element illustrated in FIG. 4, which differs from the spectral luminous efficacy distribution (precisely, CIE RGB color system) of human beings shown in FIG. 3, and cannot detect the subordinate negative sensitivity or blue sensitivity of the spectral luminous efficacy characteristic in FIG. 3. The main point of the invention is to provide a configuration to compensate for the differences for matching or making approximate the color received by the color sensor with or to isochromatically mixed color of the RGB color system. To do this, the following means are used:

(1) Compensation for subordinate positive sensitivity of red stimulation in wave range of about 400 nm to 460 nm A light reception component for receiving blue color is added to the light reception element for receiving red light.

(2) Compensation for red negative sensitivity in wave range of about 460 nm to 530 nm (portion of β), A fourth light reception element sensitive to about 460 nm to 530 nm for compensating for the spectral characteristic of a color light signal of the light reception element for receiving red light is added.

(3) Compensation for any other negative spectral area than described above, of spectral photosensitivity characteristic of each light reception element Subtraction processing of a signal generated by the light reception element having photosensitivity in a negative spectral characteristic area from a signal generated by each light reception element is performed at a setup ratio.

As for (2) described above, specifically a light reception element having the spectral sensitivity to a spectral area (BG) of intermediate color of blue (B) and green (G) is provided and subtraction processing of a signal generated in the light reception element from the red (R) color signal is performed at a ratio based on a preset factor, whereby a color signal of a new red signal (R') is formed and is used for color reproduction.

As for (3) described above, specifically color reproduction is performed based on a color signal provided in such a manner that operation processing of adding a signal generated in the element for receiving blue (B) light to the light reception element for generating a red (R) signal as a positive sensitivity component at a ratio based on a preset factor is performed and/or that subtraction processing of a signal generated in the element for receiving green (G) light from the blue (B) color signal is performed at a ratio based on a preset factor, whereby a color signal of a new blue signal (B') is formed and this new blue (B') color signal is used as a blue color signal in color mixing processing and/or that subtraction processing from the green (G) color signal is performed at a ratio based on a preset factor, whereby a color signal of a new green signal (G') is formed and this new green (G') color signal is used as a green color signal in color mixing processing.

Using (1) described above and preferably (2) described above and more preferably (3) described above in combination, a color sensor for reproducing the blue spectral characteristic (indicated by dotted line $F_B$), the green spectral characteristic (indicated by dashed line $F_G$), and the red spectral characteristic (indicated by solid line $F_R$) corresponding to the spectral luminous efficacy distribution of human beings shown in FIG. 3 can be constructed.

A more detailed description is given in the following specific embodiments:

First Embodiment

Figure 5:
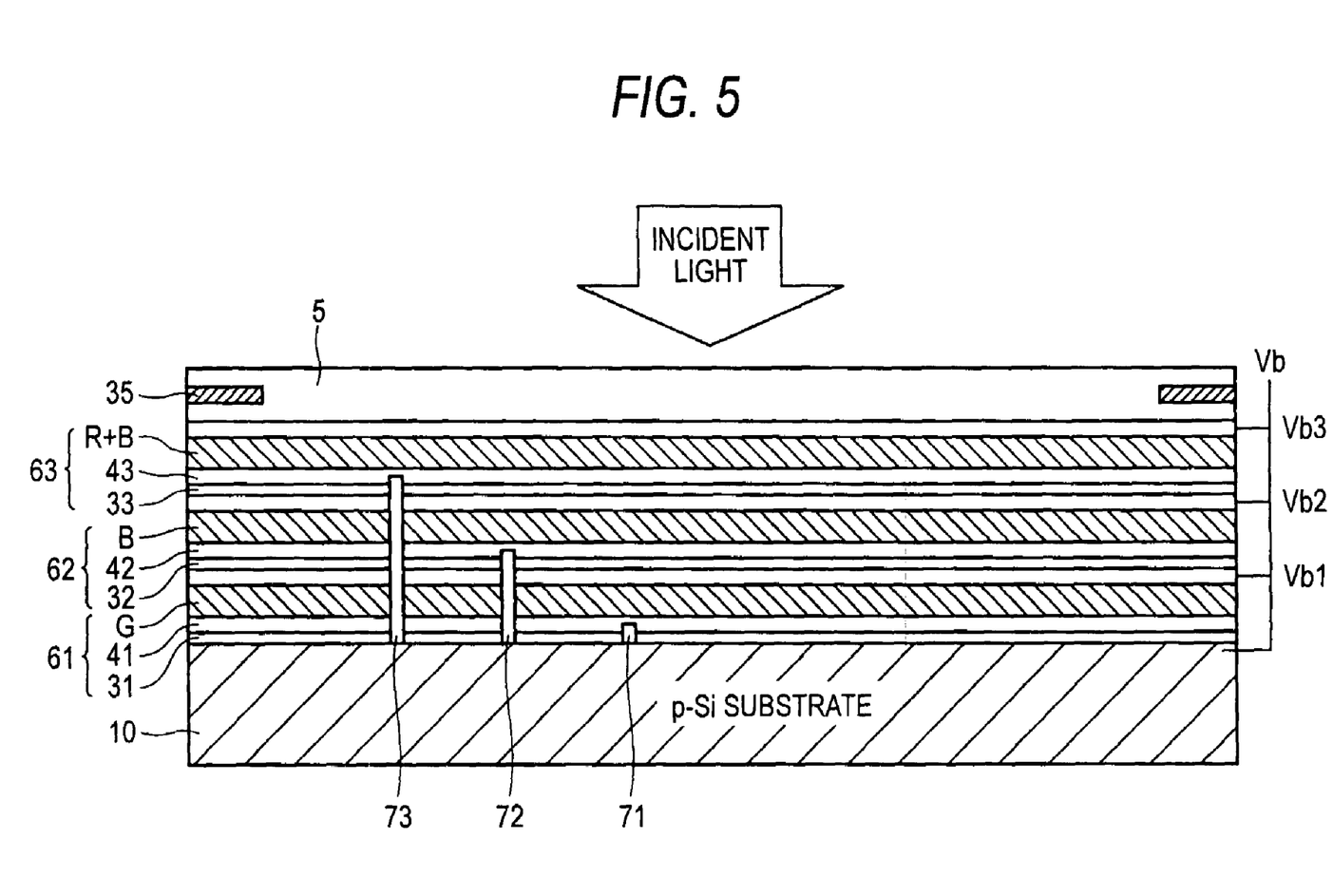
FIG. 5 is a sectional schematic drawing to show the configuration of a light reception section of a deposition color sensor showing a first embodiment of the invention.

FIG. 5 is a sectional schematic drawing to show the configuration of a light reception section of a deposition color sensor showing a first embodiment of the invention. In FIG. 5, the color sensor adopts a configuration wherein a first light reception element 61 made up of an insulating film 31, an acceptor-property layer (molecular film) 41, and a green photosensitive layer (molecular film) G, a second light reception element 62 made up of a first transparent electrode Vb1, an insulating film 32, an acceptor-property layer (molecular film) 42, and a blue photosensitive layer (molecular film) B, a third light reception element 63 made up of a second transparent electrode Vb2, an insulating film 33, an acceptor-property layer (molecular film) 43, and a red photosensitive layer (molecular film) R+B, a third transparent electrode Vb3, and a transparent insulating film 5 are deposited on a p-type Si substrate 10. Each of the first light reception element 61, the second light reception element 62, and the third light reception element 63 receives light information of the corresponding color. The photosensitive layers (molecular films) G, B, and R+B receive light and are excited for generating photoelectrons, and the acceptor-property layers (molecular films) 41, 42, and 43 receive the photoelectrons. The light signals of the colors received by the acceptor-property layers (molecular films) 41, 42, and 43 are read by the first, second, and third transparent electrodes Vb1, Vb2, and Vb3 and transfer electrodes 71, 72, and 73, and are transferred to an image reproduction system as electric signals, as described later in detail.

A first light reception element 61, a second light reception element 62, and a third light reception element 63 of the color sensor in the related art have the spectral sensitivity characteristic shown in FIG. 4 and receive light information of the corresponding colors. However, in the color sensor of the invention, the third light reception element 63 including the red photosensitive layer (molecular film) R+B has blue photosensitive molecules (serving as the first portion) added to red photosensitive molecules for receiving not only a red light signal, but also a blue light signal. In doing so, the positive sensitivity of the blue light area possessed by the stimulus values mainly based on red in the RGB color system shown in FIG. 3 (400-450-nm area) is added, so that correction is made to the spectral composition shown in FIG. 4. Therefore, correction is made so that light information of red sensitivity approaches the RGB color system, namely, the visual sense of a human being. Incidentally, the first portion that adds a signal corresponding to the stimulus value of blue (B) as a positive sensitivity component to the light reception element for generating a red (R) is not limited to the blue photosensitive molecules, and any well-known equivalent material may be employed. In the case where the first portion adds a signal corresponding to the stimulus value of blue (B) as a positive sensitivity component to a red (R) color signal generated by the light reception element for generating a red (R), the first portion is primarily constituted of a processor performing the foregoing functions. Such a processor can be a general-purpose computer.

Second Embodiment

Figure 6:
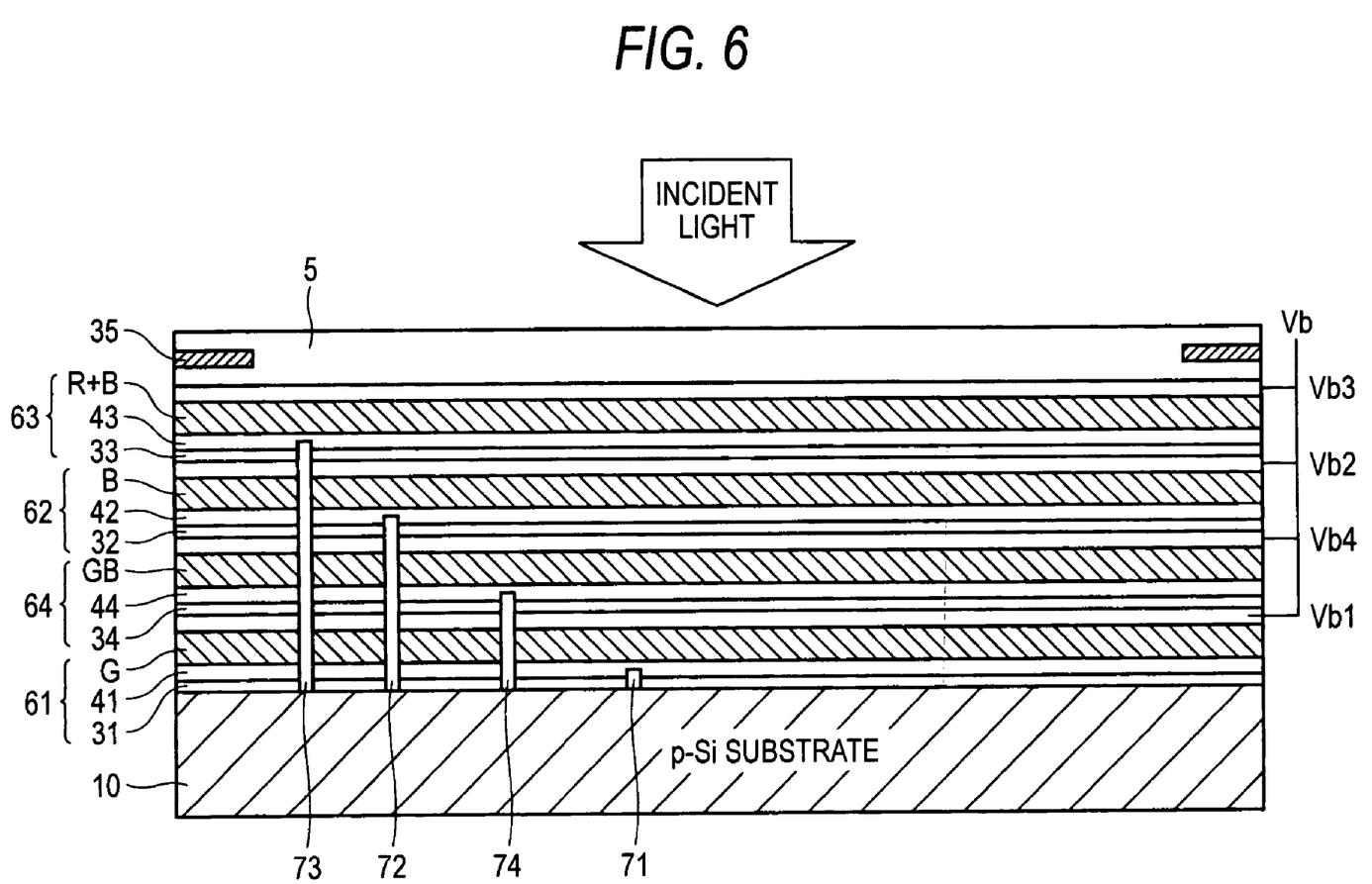
FIG. 6 is a sectional schematic drawing to show the configuration of a light reception section of a color sensor of a second embodiment of the invention.

Next, a second embodiment of the invention will be discussed with FIGS. 6 and 7. FIG. 6 is a sectional schematic drawing to show the configuration of a light reception section of a color sensor of the second embodiment of the invention. Parts identical with those previously described with reference to FIG. 5 are denoted by the same reference numerals in FIG. 6. The color sensor in FIG. 6 is the same as that of the first embodiment in FIG. 5 except that it further includes a fourth light reception element 64 made up of a photosensitive layer (molecular film) GB for receiving green light and blue light, an insulating film 34, and an acceptor-property layer (molecular film) 44. Therefore, the third light reception element 63 including the red photosensitive layer (molecular film) R+B has the blue photosensitive molecules added to the red photosensitive molecules, so that the blue sensitivity is corrected, as described above. In addition, the color sensor of the second embodiment is provided with the fourth light reception element 64.

Figure 7:
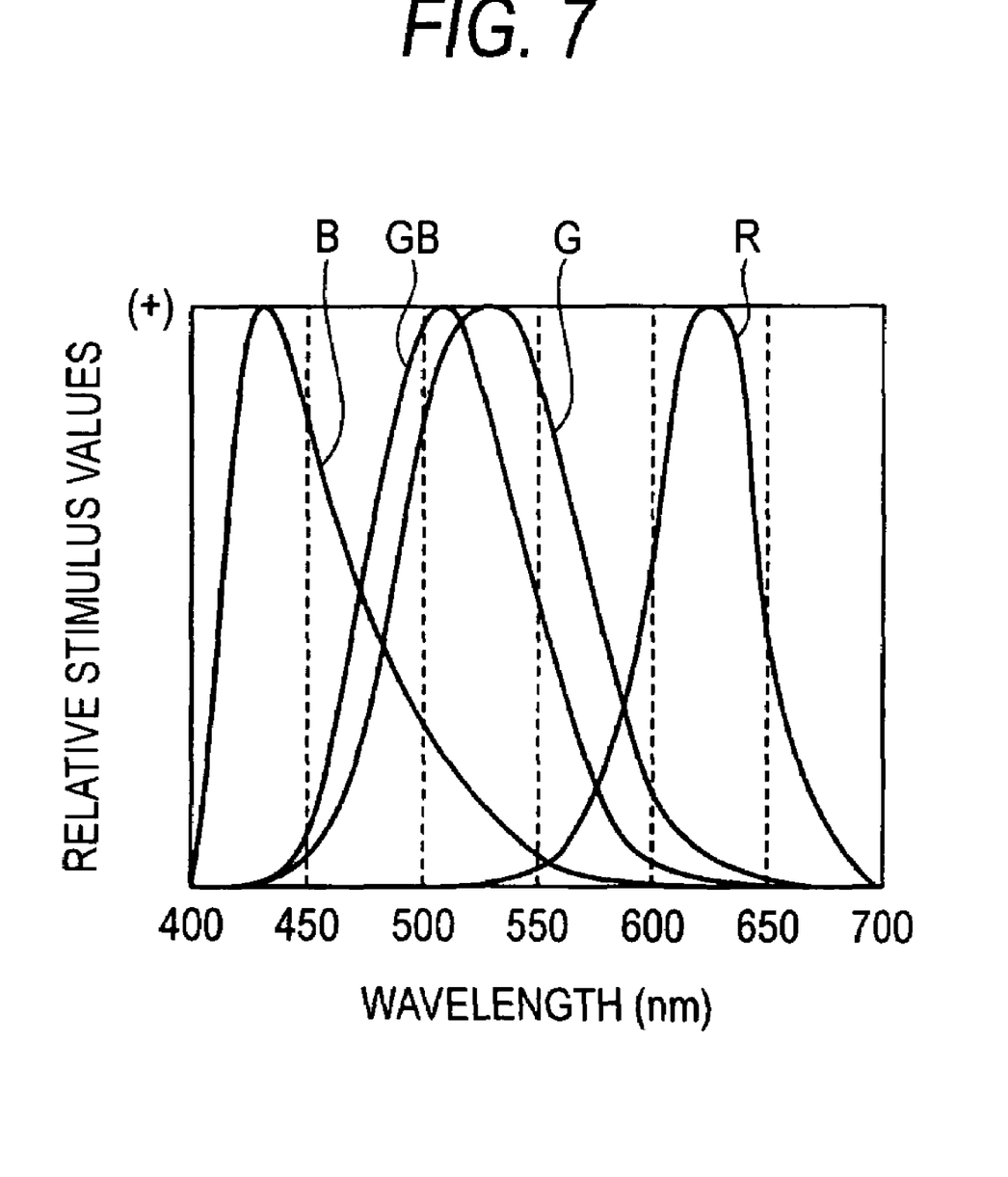
FIG. 7 shows the spectral sensitivity distributions of light reception elements of the color sensor of the second embodiment of the invention.
Figure 8:
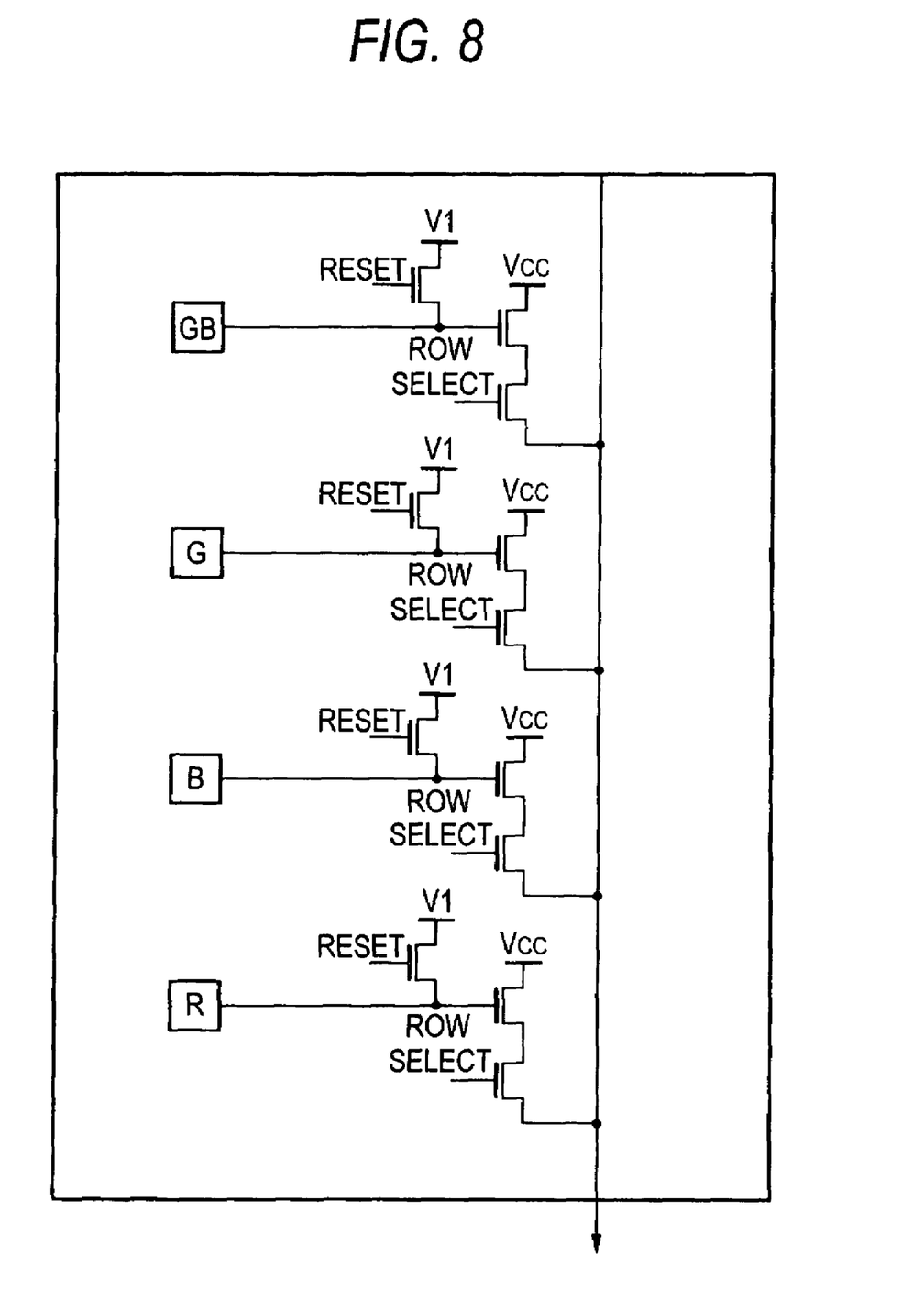
FIG. 8 shows an example of an Si transfer circuit of an image pickup device of the invention.

FIG. 7 shows the spectral sensitivity distributions of the light reception elements of the color sensor of the second embodiment. The spectral sensitivity distribution curves indicated by R, G, and B in FIG. 7 are the same as the spectral sensitivity distributions of the R, G, and B light reception elements of the color sensor of the first embodiment shown in FIG. 4, to which a fourth spectral sensitivity curve (indicated by GB) corresponding to the GB light reception element is added. Since the negative sensitivity of the GB spectral area possessed by the red color signal in FIG. 3 and the spectral sensitivity area of the fourth light reception element 64 (GB) in FIG. 7 are in almost the same spectral wave range, subtraction processing of a color signal generated in the light reception element 64 from a color signal generated in the light reception element 63 is performed by the second portion which is primarily constituted of a processor (e.g. a general-purpose computer), whereby a new red color signal having a red component in a long wave range and a red negative sensitivity component corresponding to $\beta$ in FIG. 3 (hatched area) is formed. The new color signal formed by performing the subtraction processing becomes approximate to the ideal red color signal (having the characteristic indicated by the solid line $F_R$) shown in FIG. 3.

The new red color signal is formed and a new blue color signal containing the blue negative sensitivity $\gamma$ in FIG. 3 may be formed by performing subtraction processing of green and red color signals generated in the green and red light reception elements from a blue color signal generated in the blue light reception element at a ratio based on a preset factor.

The new red color signal is formed and a new green color signal containing the green negative sensitivity $\alpha$, $\delta$ in FIG. 3 may be formed by performing subtraction processing of blue and red color signals generated in the blue and red light reception elements from a green color signal generated in the green light reception element at a ratio based on a preset factor.

As described above, in the color sensor according to the first embodiment, red, blue, and green color signals provided by compensating for the blue sensitivity component can be formed artificially, so that the color reproduction range can be enlarged as compared with the color sensors in the related arts. In the color sensor according to the second embodiment, improving the color reproducibility of the intermediate color of blue (B) and green (G) to which the red negative sensitivity component is added contributes to providing a clear reproduced image considering that the color resolution of human eyes for the area is particularly excellent.

Further, in the color sensors according to the first and second embodiments, subtraction processing of the color signal of another light reception element from the color signal generated in one of the light reception elements based on the setup factor can be performed for artificially forming almost ideal red, blue, and green color signals containing the negative sensitivity components possessed by the R, G, and B curves shown in FIG. 3, so that the color reproduction range can be enlarged as compared with the color sensors in the related arts.

Particularly, improving the color reproducibility by adding the red negative sensitivity component in the intermediate color area of blue (B) and green (G) contributes to providing a clear reproduced image because the color resolution of human eyes for the area is particularly excellent. Thus, the basis of the invention is to perform processing for at least red (R).

As the photosensitive molecules making up each photosensitive layer (molecular film) according to the invention, coloring matter, dyes, pigments, etc., having a photoelectric conversion property, namely, coloring matter, dyes, pigments, etc., capable of generating hole-electron pairs as electrons are excited by light would be able to be used without limitation. Preferably, cyanine dye, styryl dye, hemicyanine dye, merocyanine dye (containing zero methine merocyanine (simple merocyanine)), 3-nucleus merocyanine dye, 4-nucleus merocyaninedye, rhodacyaninedye, complexcyaninedye, complex merocyanine dye, allopolar dye, oxynol dye, hemioxynol dye, squalium dye, cloconium dye, azamethine dye, coumarin dye, arylidene dye, anthraquinone dye, triphenylmethane dye, azo dye, azomethine dye, spiro compound, metallocene dye, fluorenone dye, flugide dye, perylene dye, phenazine dye, phenothiazine dye, chinone dye, indigo dye, diphenylmethane dye, polyene dye, acridine dye, acridinone dye, diphenylamine dye, quinacridone dye, quinofutalon dye, phenoxazine dye, phthaloperylene dye, porphyrin dye, chlorophyll dye, phthalocyanine dye, and metal complex dye can be used.

Among them, it is desirable that coloring matter, dyes, pigments, etc., having a coloring matter skeleton high in light absorption factor, such as phthalocyanine, metal phthalocyanine complex, porphyrin, metal porphyrin complex, perylene, pyrene, merocyanine dye, and rhodamine dye should be used.

As the acceptor molecules making up each acceptor-property layer (molecular film) according to the invention, molecules capable of transporting electrons of a photosensitive layer (molecular film) would be able to be used without limitation. For example, organic molecules having a skeleton of tetracyanoquinodimethan, benzoquinone, naphthoquinone, anthraquinone, dinitrobenzene, trinitrobenzene, tricyanobenzene, hexatricyanobenzene, trinitroflubarenone, chlorobenzoquinone, dichlorobenzoquinone, trichlorobenzoquinone, dichlororhodicyanobenzoquinone, cyanobenzoquinone, dicyanobenzoquinone, tricyanobenzoquinone, N, N'-dicyanoquinonediimine, N, N'-disulfonylquinonediimine, N-carbonyl-N'-cyanoquinonediimine, N-carbonyl-N'-sulfonylquinonediimine, N-sulfonyl-N'-cyanoquinonediimine, N-sulfonyl-quinoneimine, N-cyano-quinoneimine, dithienylene copper complex, etc., can be used.

As the donor molecules making up each donor-property layer (molecular film) according to the invention, molecules capable of transporting holes of a photosensitive layer (molecular film) would be able to be used without limitation. For example, organic molecules having a skeleton of paraphenylenediamine, ortho-phenylenediamine, meta-phenylenediamine, tetrathiaflubarenone, diselenadiflubarenone, tetracelenaflubarenone, tetraselenotetracene, quinoline, acridine, ferrocene, benzidine, diaminopyrene, polydiacetylene, hydroquinone, dimethoxybenzene, diazobenzene, phenothiazine, etc., can be used.

For the organic coloring matter compounds used with the organic coloring matter thin films (for photosensitive layers, donor layers, acceptor layers, etc.,) described above, the following documents can be further referenced: "Heterocyclic Compounds-Cyanine Dyes and Related Compounds" written by F. M. Harmer, John Wiley & Sons,. New York, London, published in 1964, "Heterocyclic Compounds-Special topics in heterocyclic chemistry" written by D. M. Sturmer, Chapter 18, Section 14, pages 482 to 515, John Wiley & Sons, New York, London, published in 1977, "Rodd's Chemistry of Carbon Compounds" 2nd. Ed. vol. IV, part B, published in 1977, chapter 15, pages 369 to 422, Elsevier Science Publishing Company Inc.), New York, and the like.

In addition, dyes described on pages 23 and 24 of Research Disclosure (RD) 17643, right column of page 648 to right column of page 649 of RD 18716, right column of page 996 to right column of page 998 of RD 308119, and lines 7 to 10 of page 65 of European Patent No. 0565096A1. Dyes having partial structures or structures shown in general formulae and specific examples described in U.S. Pat. No. 5,747,236 (particularly, pages 30 to 39), U.S. Pat. No. 5,994,051 (particularly, pages 32 to 43), and U.S. Pat. No. 5,340,694 (particularly, pages 21 to 58, however, in the coloring matter (dyes and pigments) shown in (XI), (XII), and (XIII), the number of n12, n15, n17, n18 is not limited and each an integer of 0 or more (preferably, 4 or less)) can also be used preferably.

The organic compound layers may be formed by a dry film forming method or a wet film forming method. As specific examples of the dry film forming method, a vacuum evaporation method, an ion plating method, a physical vapor phase epitaxial method of MBE method, etc., or a CVD method of plasma polymerization, etc., can be named. As the wet film forming method, a cast method, a spin coating method, a dipping method, an LB method, etc., is used.

As homogeneous transparent electrode, tin oxide ($SnO_2$), titanium oxide ($TiO_2$), indium oxide ($InO_2$), indium tin oxide (ITO) thin film may be used. As the formation method, a laser abration method, a sputtering method, etc., can be used.

A reflection prevention film is provided on the top layer, whereby the loss of light can be decreased. Preferably, the film is a transparent insulating film having a film thickness of $\lambda/4n$ relative to the wavelength in the neighborhood of 550 nm (n: Refractive index of the film).

As the insulating layer, any known insulating material can be used. Preferably, an insulating film of $SiO_2$, etc., or high polymeric organic material generally used as a binder for image record material is used; for example, preferably, acrylic, methacrylic, vinyl-based polymeric material, etc., is used. Particularly, polymethacrylate material such as isobutylmethacrylate is excellent in both insulating property and application property.

<Signal Read System>

Next, the signal read and transfer system of an electric signal of an image provided by executing photoelectric conversion by each light reception element in the color sensor of the invention will be discussed.

A signal can be taken out from an organic light reception element in a similar manner to that of taking out a signal from a usual silicon light reception element. For example, a given amount of bias charges is poured into a charge storage diode (refresh mode) and given charges are stored (photoelectric conversion mode) and then signal charges are read. The organic light reception element can be used as a charge storage diode or a separate charge storage diode can also be added. To read the signal charges, CCD and CMOS sensor read techniques described below can be applied. The image pickup device has light reception elements each having a photoelectric conversion function, a storage function of the provided signal, a read function of the stored signal, a pixel position selection function, etc. The signal charge or signal current into which light is converted by the light reception section is stored in the light reception section or an added capacitor. The stored charges are read together with pixel position selection according to a technique of a charge-coupled device (CCD) or a MOS image pickup device using an X-Y address system (CMOS sensor).

As a transfer read system using a CCD, a method wherein a charge transfer section for transferring a pixel charge signal to an analog shift register by a transfer switch is provided and signals are read to the output end in order by register operation can be named. Line address type, frame transfer type, interline transfer type, frame interline transfer type, etc., can be named. A two-phase structure, a three-phase structure, a four-phase structure, a buried channel structure, and the like of CCDs are known, but any structure can be used.

In addition, as an address selection system, pixels can be selected in order one at a time using a multiplexer switch and a digital shift register and the pixel is read to a common output line as a signal voltage (or charge). A two-dimensional array of image pickup device with address operation is known as a CMOS sensor. A switch provided for a pixel connected to an intersection point of X-Y is connected to a vertical shift register. When the switch is turned on based on voltage from the vertical scanning shift register, the signal read from the pixel provided on the same row is read to the output line in the column direction. The signal is read in order from the output end through a switch driven by a horizontal scanning shift register. To read the output signal, a floating diffusion detector or a floating gate detector can be used. S/N can also be improved by providing a signal amplification circuit for a pixel portion or according to a technique of correlated double sampling, etc. As signal processing, gamma correction using an ADC circuit, digitalization using an AD converter, intensity signal processing, and color signal processing can be performed. As the color signal processing, white balance processing, color separation processing, color matrix processing, etc., can be named. To use an NTSC signal, RGB signal can be converted into YIQ signal.

As the color sensor of the invention, a single element before deposition is shown in examples described below, but a photoelectric conversion element array having deposition elements at a high density can also be formed.

Forming a light shield film and avoiding color mixing are required for the array. A transparent insulating film is formed on the top face and metal is evaporated with an opening, whereby a light shield film can be formed.

A microlens array is formed above a light reception element, whereby light gathering efficiency can be further improved.

To mix blue sensitive molecules with a red photosensitive layer (molecular film), the amount of the blue sensitive molecules is 2-30 mole % of red sensitive molecules, preferably 5-20 mole %.

A red photosensitive layer (molecular film) and a blue photosensitive layer (molecular film) may be deposited on each other to use the resultant R+B photosensitive layer (molecular film) group instead of mixing blue sensitive molecules with a red photosensitive layer (molecular film).

Preferably, ultraviolet and infrared cut filters are provided.

It is preferred to provide a film for shielding light not absorbed in the insulating film formed on the top layer of Si. Alternatively, the electrode on the bottom layer may be formed of opaque metal.

EXAMPLES

Specific examples of the invention are shown below, but the invention is not limited to the specific examples.

To check the color sensor of the first embodiment shown in FIG. 5 for operation, an organic semiconductor was used as a photoconductive conversion film on an Si transfer circuit and four layers of an insulating film, a transparent conductive film, an organic semiconductor, and a transparent conductive film were deposited to prepare a light reception element.

Light reception elements having red (R), blue (B), and green (G) spectral characteristics were used in combination, CIE D50 light (standard indoor daylight) was applied to them, and the irrespective color signals were generated by performing photoelectric conversion and were stored in acceptor-property layers (molecular films). The red (R), blue (B), and green (G) spectral characteristics were obtained by appropriately selecting from the photosensitive molecules described above.

Coloring matter having sensitivity to blue (B) was mixed with the photosensitive layer (molecular film) of the red (R) light reception element (specimen 1).

Further, to check the color sensor of the second embodiment shown in FIG. 6 for operation, light reception elements having red (R), blue (B), blue green (BG), and green (G) spectral characteristics were used in combination to form specimen 2. CIE D50 light (standard indoor daylight) was applied to the light reception elements, and their respective color signals were generated by performing photoelectric conversion and were stored in acceptor-property layers (molecular films). Electric circuits of a transfer circuit, read, etc., were constructed according to the descriptions of JP-A-2003-298102 and JP-A-58-103165.

For image formation, operations are performed with the amplification factors of the signals changed, thereby making a correction. The GB light reception amount multiplied by a predetermined magnification is subtracted from the red signal and is added to the green signal. The signal sensitive to blue is multiplied by a predetermined magnification and subtraction from the green sensitivity is performed. The signal sensitive to green is subtracted from the blue signal at a predetermined magnification. The blue signal is multiplied by a predetermined magnification and is added to the red signal. The operation processing was performed conforming to the description of Patent No. 287259.

In image formation of other colors, operations are performed with the amplification factors of the signals changed, thereby making a correction.

The green light reception amount multiplied by a predetermined magnification is subtracted from the red signal and is added to the green signal. The signal sensitive to blue is multiplied by a predetermined magnification and subtraction from the green sensitivity is performed. The signal sensitive to green is subtracted from the blue signal at a predetermined magnification. The blue signal is multiplied by a predetermined magnification and is added to the red signal. The operation processing was also performed conforming to the description of Patent No. 287259.

To add blue photosensitive substance to the red element and perform photoelectric conversion, blue is automatically added and signal processing of adding blue to red becomes unnecessary.

In the invention, the positive spectral sensitivity to blue is added to the light reception element for generating a red signal, preferably the fourth light reception element having spectral sensitivity to the spectral area (BG) of intermediate color of blue and green is provided and subtraction processing of a BG signal generated in the light reception element from the red signal is performed, more preferably addition/subtraction processing with color signal for negative spectral sensitive area from each light reception element is performed. Consequently, the color reproduction area can be enlarged as compared with the color sensors in the related arts and it is made possible to form an intensity signal and a color difference signal by a color signal having color sensitivity similar to the human sensibilities to reproduce an image; a clear image can be represented.

The entire disclosure of each and every foreign patent application from which the benefit of foreign priority has been claimed in the present application is incorporated herein by reference, as if fully set forth.

What is claimed is:

1. A color sensor comprising:

light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R); and a first portion that adds a signal corresponding to the stimulus value of blue (B) as a positive sensitivity component to one of: the first light reception element; and a red (R) color signal generated by the first light reception element;

wherein the light reception elements further comprises: a light reception element that generates a blue (B) color signal corresponding to the stimulus values of blue (B), wherein an output of the light reception element that generates a blue (B) color signal is added to one of: the first light reception element and the red (R) color signal, to produce an altered red signal and further comprising:

a fourth light reception element having spectral sensitivity to a spectral area (BG) of intermediate color of blue (B) and green (G) in the RGB color system; and a second portion that performs subtraction processing of a signal generated in the fourth light reception element from the red color signal (R) at a ratio based on a preset factor, before or after the blue color signal is added;

wherein a modified red color signal (R'), modified by both the addition of the blue (B) color signal and the subtraction of the signal generated in the fourth light reception element, is formed.

2. The color sensor as claimed in claim 1,
wherein the light reception elements further comprises: a second light reception element that generates a green (G) color signal corresponding to the stimulus values of green (G); and a third light reception element that generates a blue (B) color signal corresponding to the stimulus values of blue (B), and
wherein the first light reception element comprises a first photoelectric conversion film having a maximum value of main light absorption of 580 to 650 nm, the second light reception element comprises a second photoelectric conversion film having a maximum value of main light absorption of 530 to 560 nm, and the third light reception element comprises a third photoelectric conversion film having a maximum value of main light absorption of 400 to 460 nm.

3. The color sensor as claimed in claim 1,
wherein the light reception elements are configured to form deposition films comprising an organic semiconductor on an Si substrate.

4. The color sensor as claimed in claim 1,
wherein the first light reception element is provided as a top layer of the light reception elements, the top layer being adjacent to a light reception face of the color sensor, and
wherein the first light reception element comprises a first material having red sensitivity and a second material having blue sensitivity, the second material serving as the first portion.

5. The color sensor as claimed in claim 4, wherein the second material is organic coloring matter.

6. The color sensor as claimed in claim 4, wherein the second material is semiconductor ultrafine particles.

7. A color image pickup method comprising:
picking up an image with the light reception elements of a color sensor as claimed in claim 1; and
performing operation processing of adding a signal corresponding to the stimulus value of blue (B) as a positive sensitivity component to a red (R) color signal generated by the first light reception element, so as to perform color reproduction;
performing subtraction processing of a signal generated in an element for having spectral sensitivity to a spectral area (BG) of intermediate color of blue (B) and green (G) in the RGB color system from the red (R) color signal at a ratio based on a preset factor, before or after the blue color signal is added, wherein a modified red color signal (R'), modified by both the addition of the blue (B) color signal and the subtraction of the (BG) signal, is formed; and
applying the new red color signal (R') as the red color signal in color mixing processing, so as to perform the color reproduction,
wherein the light reception elements of the color sensor of claim 1 further comprises: a light reception element that generates a blue (B) color signal corresponding to the stimulus values of blue (B),
wherein an output of the light reception element that generates a blue (B) color signal is added to one of: the first light reception element; and
the red (R) color signal, to produce an altered red signal.

8. The color image pickup method as claimed in claim 7, further comprising:
performing subtraction processing of a signal generated in an element for receiving green (G) from the red (R) color signal at a ratio based on a preset factor, so as to form a new red color signal (R'); and
applying the new red color signal (R') as the red color signal in color mixing processing, so as to perform the color reproduction.

9. The color image pickup method as claimed in claim 7, further comprising:
performing subtraction processing of a signal generated in an element for receiving green (G) from the blue (B) color signal at a ratio based on a preset factor, so as to form a new blue color signal (B'); and
applying the new blue color signal (B') as a blue color signal in color mixing processing, to perform color reproduction.

10. The color image pickup method as claimed in claim 7, further comprising:
performing subtraction processing of a signal generated in an element for receiving blue (B) from the green (G) color signal at a ratio based on a preset factor, so as to form a new green color signal (G'); and
applying the new green color signal (G') as a green color signal in color mixing processing, so as to perform color reproduction.

11. A color image pickup method comprising:
picking up an image with the light reception elements of a color sensor, wherein said color sensor includes, light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R); a first portion that adds a signal corresponding to the stimulus value of blue (B) as a positive sensitivity component to one of: the first light reception element; and a red (R) color signal generated by the first light reception element; a fourth light reception element having spectral sensitivity to a spectral area (BG) of intermediate color of blue (B) and green (G) in the RGB color system; and a second portion that performs subtraction processing of a signal generated in the fourth light reception element from the red (R) color signal at a ratio based on a preset factor, so as to form a new red color signal (R'), a light reception element that generates a blue (B) color signal corresponding to the stimulus values of blue (B), wherein an output of the light reception element that generates a blue (B) color signal is added to one of: the first light reception element; and the red (R) color signal, to produce an altered red signal;
performing operation processing of adding a signal corresponding to the stimulus value of blue (B) as a positive sensitivity component to a red (R) color signal generated by the first light reception element;
performing subtraction processing of a signal generated in the fourth light reception element from the red (R) color signal at a ratio based on a preset factor, so as to form a new red color signal (R'); and
applying the new color red (R') color signal as a red color signal in color mixing processing, so as to perform color reproduction.

12. The color image pickup method as claimed in claim 11, further comprising:
performing subtraction processing of a signal generated in an element for receiving green (G) from the blue (B) color signal at a ratio based on a preset factor, so as to form a new blue color signal (B'); and applying the new blue color signal (B') as a blue color signal in color mixing processing, to perform color reproduction.

13. The color image pickup method as claimed in claim 11, further comprising:

performing subtraction processing of a signal generated in an element for receiving blue (B) from the green (G) color signal at a ratio based on a preset factor, so as to form a new green color signal (G'); and applying the new green color signal (G') as a green color signal in color mixing processing, so as to perform color reproduction.

14. A color sensor comprising:

light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R);

a fourth light reception element having spectral sensitivity to a spectral area (BG) of intermediate color of blue (B) and green (G) in the RGB color system; and a second portion that performs subtraction processing of a signal generated in the fourth light reception element from the red color signal (R) at a ratio based on a preset factor, before or after the blue color signal is added;

wherein a modified red color signal (R'), modified by both the addition of the blue (B) color signal and the subtraction of the signal generated in the fourth light reception element, is formed;

means for adding a signal corresponding to the stimulus value of blue (B) as a positive sensitivity component to one of: the first light reception element; and a red (R) color signal generated by the first light reception element;

a fourth light reception element having spectral sensitivity to a spectral area (BG) of intermediate color of blue (B) and green (G) in the RGB color system; and a second portion that performs subtraction processing of a signal generated in the fourth light reception element from the red color signal (R) at a ratio based on a preset factor, before or after the blue color signal is added;

wherein a modified red color signal (R'), modified by both the addition of the blue (B) color signal and the subtraction of the signal generated in the fourth light reception element, is formed, wherein the light reception elements further comprises: a light reception element that generates a blue (B) color signal corresponding color signal corresponding to the stimulus values of blue (B), wherein an output of the light reception element that generates a blue (B) color signal is added to one of: the first light reception element; and the red (R) color signal, to produce an altered red signal.

15. The color sensor as claimed in claim 14, further comprising:

a fourth light reception element having spectral sensitivity to a spectral area (BG) of intermediate color of blue (B) and green (G) in the RGB color system; and means for performing subtraction processing of a signal generated in the fourth light reception element from the red (R) color signal at a ratio based on a preset factor, so as to form a new red color signal (R').

16. A color image pickup method comprising:

picking up an image with the light reception elements of a color sensor wherein said color sensor includes, light reception elements that generate color signals corresponding to stimulus values of colors in an RGB color system, the stimulus values of colors comprising a stimulus value of blue (B) and a stimulus value of red (R), wherein the light reception elements comprise a first light reception element that generates a red (R) color signal corresponding to the stimulus values of red (R); a first portion that adds a signal corresponding to the stimulus value of blue (B) as a positive sensitivity component to one of: the first light reception element; and a red (R) color signal generated by the first light reception element; a fourth light reception element having spectral sensitivity to a spectral area (BG) of intermediate color of blue (B) and green (G) in the RGB color system; and a second portion that performs subtraction processing of a signal generated in the fourth light reception element from the red (R) color signal at a ratio based on a preset factor, so as to form a new red color signal (R'), a light reception element that generates a blue (B) color signal corresponding to the stimulus values of blue (B), wherein an output of the light reception element that generates a blue (B) color signal is added as a positive sensitivity component to one of the first light reception element, and the red (R) color signal;

performing subtraction processing of a signal generated in the fourth light reception element from one of the first light reception element, and the red (R) color signal, wherein a modified red color signal (R'), modified by both the addition of the blue (B) color signal and the subtraction of the signal generated in the fourth light reception element, is formed; and applying the new color red (R') color signal as a red color signal in color mixing processing, so as to perform color reproduction.

* * * * *